United States Patent
Holmquist et al.

(10) Patent No.: US 6,553,444 B1
(45) Date of Patent: Apr. 22, 2003

(54) METHOD AND SYSTEM FOR SENSING THE PROPER INSERTION OF A PORTABLE MEMORY ELEMENT

(75) Inventors: Thomas W. Holmquist, Fort Collins, CO (US); Joseph A. Eccher, Loveland, CO (US); Nicholas D. Thayer, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/429,747

(22) Filed: Oct. 28, 1999

(51) Int. Cl.[7] .................. G06F 12/00; G11B 17/00
(52) U.S. Cl. ................................................ 710/301
(58) Field of Search .................. 710/301, 302, 710/304, 104; 360/97.01; 369/75.2, 77.2

(56) References Cited

U.S. PATENT DOCUMENTS

| 4,646,176 | A |   | 2/1987  | Shimaoka |         |
|-----------|---|---|---------|----------|---------|
| 4,731,776 | A |   | 3/1988  | Ishii    |         |
| 4,829,504 | A |   | 5/1989  | Sunaga   |         |
| 5,386,567 | A | * | 1/1995  | Lien et al. | 710/302 |
| 5,454,080 | A | * | 9/1995  | Fasig et al. | 710/302 |
| 5,619,660 | A | * | 4/1997  | Scheer et al. | 710/301 |
| 5,815,647 | A | * | 9/1998  | Buckland et al. | 710/302 |
| 6,098,132 | A | * | 8/2000  | Olarig et al. | 710/302 |
| 6,138,194 | A | * | 10/2000 | Klein et al. | 710/302 |
| 6,175,491 | B1| * | 1/2001  | Park     | 361/686 |

FOREIGN PATENT DOCUMENTS

| DE | 3941086   |    | 6/1991  |
| DE | 29613291  | U  | 10/1996 |
| DE | 19644920  |    | 4/1998  |
| DE | 19649976  |    | 5/1998  |
| EP | 0735533   | A2 | 10/1996 |
| GB | 2333845   | A  | 8/1999  |

* cited by examiner

Primary Examiner—Glenn A. Auve
(74) Attorney, Agent, or Firm—David M. Mason

(57) ABSTRACT

The present invention provides a device for sensing when a portable memory element ("PME") has been properly inserted and secured within a receiving port. The present invention achieves the objective by recognizing a change in an inductive current once a locking device properly secures the PME within an optimal location of the receiving port.

11 Claims, 3 Drawing Sheets

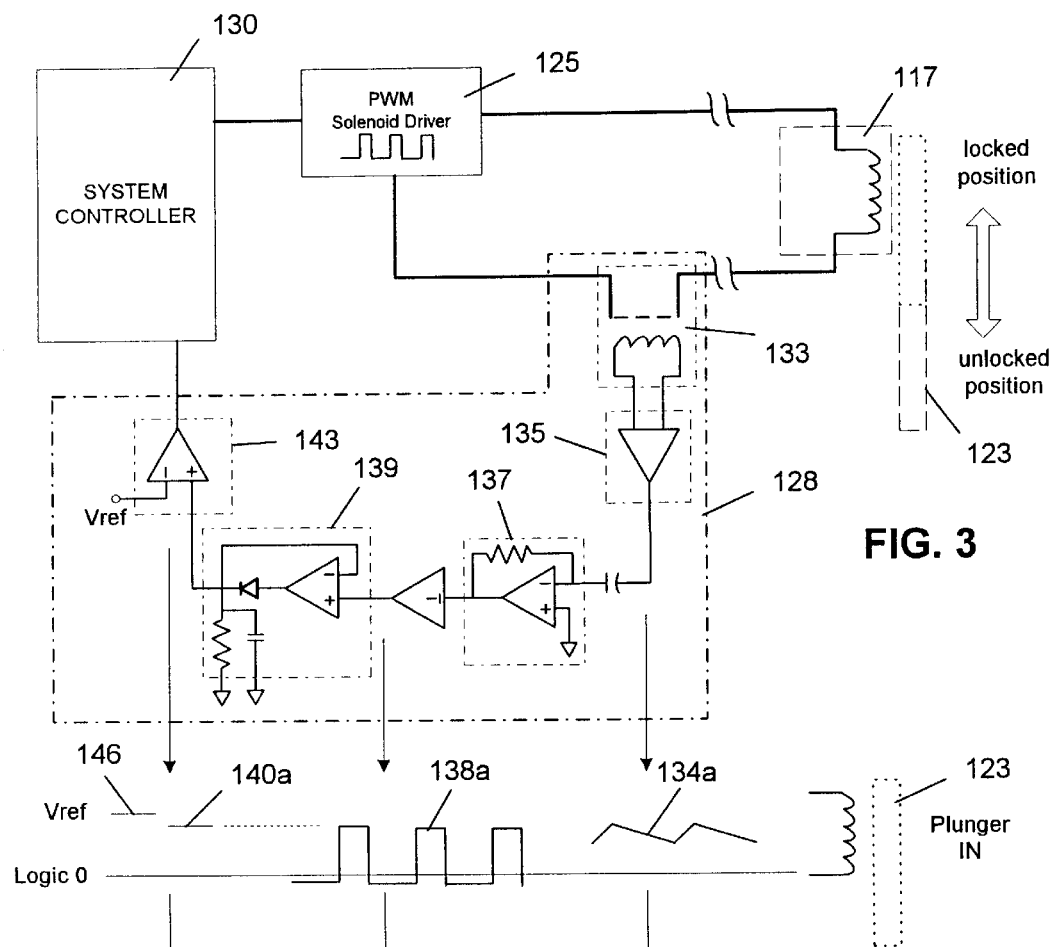
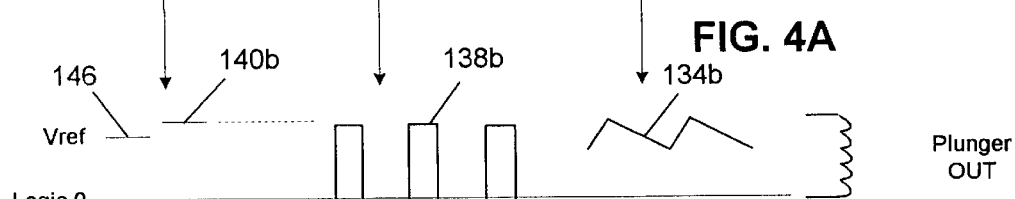
FIG. 4A
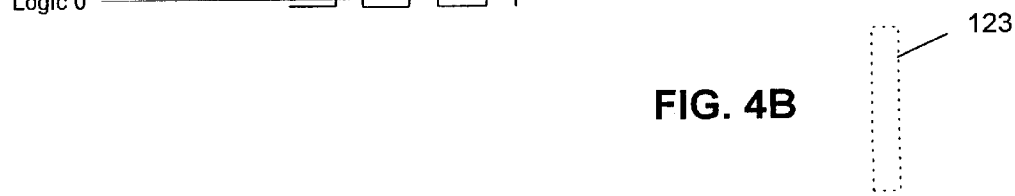
FIG. 4B

METHOD AND SYSTEM FOR SENSING THE PROPER INSERTION OF A PORTABLE MEMORY ELEMENT

BACKGROUND OF THE INVENTION

1. Field of the Invention

This invention relates in general to a device for recognizing when a structure has been properly positioned in a receiving bay, and more particularly to a process and apparatus for sensing when a portable memory element or casing for holding the same is properly locked into an operational position.

2. Description of the Related Art

Many electronic devices today read and/or write data to/from a portable memory element ("PME"). The PME is typically secured within a casing and contained by a structure that houses and/or provides means for the PME to communicate with a microprocessor or central processing unit ("CPU"). The containing structure could be anything from a simplistic calculator or a personal computer ("pc") to a complex robot or supercomputer that provides a port for receiving a casing that contains one or more PMEs, such as a magnetic tape.

In order for a microprocessor to effectively and efficiently read and/or write the necessary data to/from the PME, it is essential that the casing of the PME(s) be properly inserted within the receiving port of the containing structure. Consequently, many ports for receiving a PME provide a means for physically securing the inserted PME casing within the port. However, the mere process of moving a lever or hook to latch onto a PME casing does not guarantee that the lever has been properly engaged to secure the same. Consequently, if the PME casing is not properly secured within the receiving port, data transferred to/from the PME of a casing may be lost or a desired PME of the casing will not be able to be retrieved and moved to a desired location for an evaluation.

It would be advantageous to develop a receiving port for a containing structure that provides a feedback circuit for recognizing when a portable memory element casing has been properly inserted and locked into a desired position.

SUMMARY OF THE INVENTION

In one aspect of the present invention, a sensing apparatus is provided for recognizing the proper insertion of a portable memory element ("PME") within a receiving port of a containing structure having a locking device for securing the same. More specifically, the apparatus includes a system controller, a signal generator, a sensing element having a signal input and an output electrically coupled to the signal generator, and a detector circuit electrically coupled between the signal generator, sensing element, and system controller. The detector circuit evaluates the signal from the output of the sensing element to determine if the locking device has properly secured the inserted PME within the receiving port of the containing structure.

In another aspect of the instant invention, a method is provided for using the above apparatus. The method comprises inserting a PME within a receiving port; activating a locking element to secure the inserted PME; and sensing if the locking element properly engages with the inserted PME.

BRIEF DESCRIPTION OF THE DRAWINGS

Other aspects and advantages of the invention will become apparent upon reading the following detailed description and upon reference to the drawings, in which:

FIGS. 3 and 4A–4B illustrate a detailed circuit layout of FIG. 2 and a graph showing the operational wave forms of the same in accordance with the embodiments of FIGS. 1 and 2.

Figure 1:
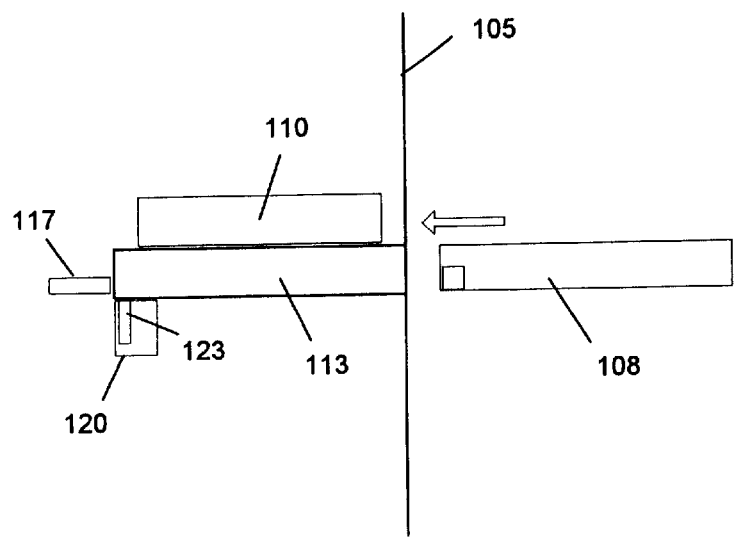
FIG. 1 illustrates a basic cut-away view of an apparatus for using the inventive locking sensor circuit according to one embodiment of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention provides an efficient and effective means of sensing if a portable memory element ("PME") is properly positioned and secured within a receiving port. Unlike many known devices for only detecting the insertion of a PME, the present invention also determines if a locking element has been properly engaged within the casing of the PME to secure the inserted PME in a desired position. Once determined, a conventional device can read and/or write data to/from the PME under an optimal data transmission condition.

Referring now to the drawings, FIG. 1 illustrates a basic cut-away view of the inventive structure according to a first embodiment. In particular, FIG. 1 shows a portion of a containing structure 105 for receiving a data storage medium or PME 108. The structure 105 could be a part of computer, a robot, an airplane, etc. Within structure 105, a conventional device 110 for reading and/or writing data is secured to an exterior wall of port 113 for receiving the PME 108. The receiving port 113 provides a dimensional space appropriate for receiving the desired casing of at least one PME 108. The PME 108 comprises a casing that may include any conventional structure that holds or contains one or more data storage medians for storing and/or providing data information or instructions to/from a system controller or personal computer (neither shown).

Adjacent to device 110, a sensor element 117 secures to the exterior wall of receiving port 113. In addition, a conventional locking element 120 secures to the exterior wall of port 113 such that a movable plunger 123 can be engaged within a hole of the inserted PME casing. A person of ordinary skill in the relevant arts will appreciate that each component of the above structure can be secured to a peripheral surface of the receiving port using a conventional method. In addition, the position of device 110, sensor 117 and locking element 120 may vary depending on the type and size of the PME 108, its casing, or the restriction of the accommodating structure 105.

As an alternative embodiment, structure 105 could be designed to receive a PME casing that contains one or more PMEs. Such a structure would provide a conventional system for selecting a desired PME from the casing, such as an automated arm, and transport the desired PME to an alternative location so that a conventional read/write device 110 can obtain/provide information to/from the removed PME.

Figure 2:
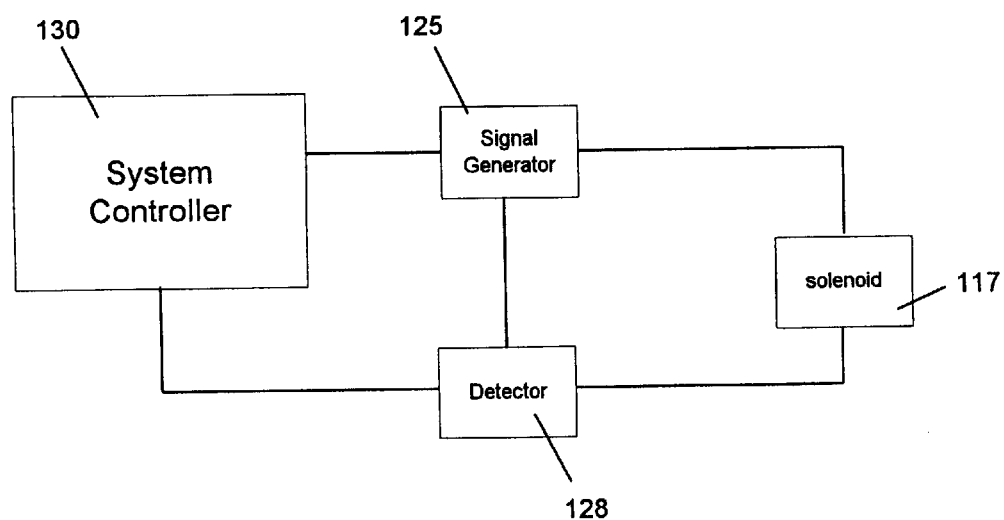
FIG. 2 illustrates a circuit component layout of the inventive locking sensor circuit in accordance with the embodiment of FIG. 1.

Referring to FIG. 2, a basic circuit component layout is provided in accordance with a preferred embodiment of the inventive sensor device 117 of FIG. 1. In this embodiment, sensor element 117 includes a conventional solenoid electrically coupled between a signal generator 125 and a detector circuit 128. The signal generator 125 is preferably a conventional pulse width modulator ("PWM"). A conventional system controller 130 also couples between the signal generator 125 and detector circuit 128 to evaluate information obtained by the detector circuit 128.

As an alternative embodiment, the sensor device 117 could be a conventional optical encoder, and signal generator 125 could produce other signal waveforms selected from the group including a square wave, sawtooth wave, triangular wave and sinusoidal wave. In addition, the system controller 130 could be as simplistic as an array of logic gates or as complex as a microprocessor or personal computer that provides memory and an algorithm to evaluate the data obtained from the sensor 117 and detector circuit 128.

The detector circuit 128 provides an efficient and effective way to receive, manipulate and compare the current signals received from the inductive solenoid 117. More specifically, as illustrated in FIGS. 3A and 3B, detector circuit 128 provides a current sensing device 133 coupled between the signal generator 125, solenoid 117, and system controller 130. The current sensing device 133 may be a conventional device selected from the group including an optical sensor and an inductive solenoid During operation, current sensing device 133, such as a conventional solenoid, inductively couples with the current loop developed between the solenoid 117 and the PWM 125, and amplifies the inductive signal 134*a* or 134*b* with a conventional amplifier 135. Next, the inductive signal 134*a* or 134*b* passes through a conventional derivative circuit 137 to be inverted into a pulsed signal 138*a* or 138*b* having a max voltage. Lastly, a conventional peak detecting circuit 139 determines the max voltage 140*a* or 140*b* obtained by the pulsed signal and a conventional comparator circuit 143 compares the max voltage 140*a* or 140*b* to a predetermined reference voltage 146. If the reference voltage 146 is greater than the max voltage 140*a* as illustrated in FIG. 4A, the system controller 130 will acknowledge that the portable memory element is not properly secured. On the other hand, if the reference voltage 146 is less than the max voltage 140*b* as illustrated in FIG. 4B, the system controller 130 will acknowledge that the PME is properly secured and ready for optimal data transmission.

Figure 5A:
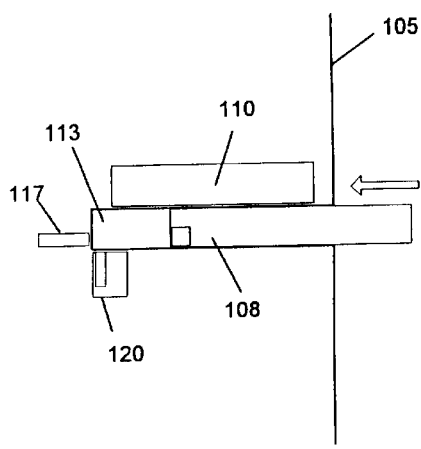
FIGS. 5A–6B illustrate the process steps for inserting, locking and sensing that a portable memory element has been properly positioned.
Figure 5B:
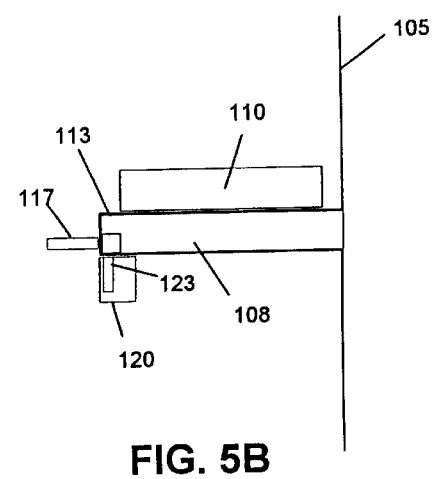

Now that the primary structural features, circuit layout and circuit operation of the invention have been described, the process for using the same will now follow with reference to FIGS. 5A–B and 6A–B. More specifically, as illustrated in FIGS. 5A and 5B, the first step involves aligning a portable memory element ("PME") 108 with a receiving port 113 of a containing structure 105. Next, PME 108 is inserted within the port 113 until a necessary portion of the PME has been received by the containing structure 105.

Figure 6A:
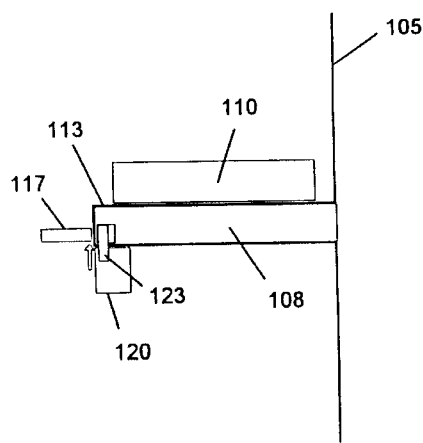

With the PME inserted into port 113, the user or the system controller 130 will instruct a locking device 120 to actuate a securing plunger 123. If the PME 108 is properly inserted into the receiving port 113, the plunger 123 will lodge within a portion of the casing that contains or holds the PME 108 to ensure an optimal operational position as illustrated in FIG. 6A. When the plunger 123 properly secures the PME 108 within the port 113, the magnetic field and output signal provided by the sensing element 117 will change.

The detector circuit 128 will recognize this change and the results will be transferred to the system controller 130 (see FIG. 3). The system controller 130 will advise the user to proceed with reading and/or writing data to/from the PME 108 or to initiate a mechanism to obtain and move the desired PME 108 for the same.

Figure 6B:
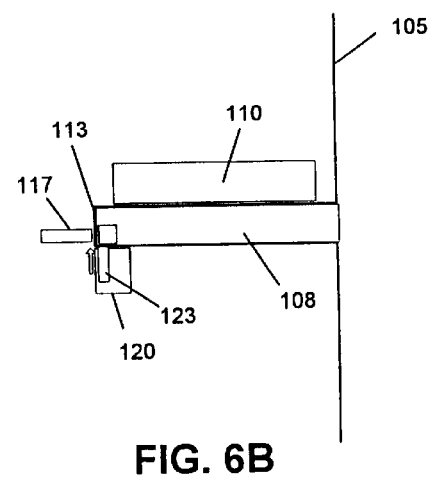

In contrast, if the plunger 123 is not properly inserted to secure the PME 108 as illustrated in FIG. 6B, the detector circuit 128 will not recognize a change in the magnetic field or signal produced by the sensing element 117. Therefore, the user will be advised that a PME 108 has not been properly inserted and that the PME 108 will need to be reinserted into the desired port 113.

As described earlier, any change in the magnetic field or current observed by the detector circuit 128 (see FIGS. 2. & 3) can be evaluated by a system controller having a simple logic circuit or a conventional CPU having a memory to utilize a mathematical algorithm. Once evaluated, the user will be provided with a visual display using a computer screen or LED display, or provided with an audible alarm.

In summary, the present invention provides a reliable, cost efficient, and effective way to reduce transmitted data from being lost during a read and/or write operation with an inserted portable memory element that has not been properly secured or positioned for optimal operation.

What is claimed is:

1. A sensing device for recognizing the proper insertion of a portable memory element ("PME") within a receiving port of a containing structure having a locking device for securing the PME, the apparatus comprising:

a system controller;

a signal generator;

a sensor element having a signal input and an output electrically coupled to the signal generator; and a detector circuit having a current sensing device inductively coupled to the signal generator and the output of the sensor element and serially coupled to the system controller, wherein the detector circuit evaluates a signal from the output of the sensor element to determine if the locking device has properly secured the inserted PME within the receiving port of the containing structure.

2. The device of claim 1, wherein the sensor element is a solenoid.

3. The device of claim 1, wherein the sensor element is an optical sensor.

4. The apparatus of claim 1, wherein the current sensing device is an optical sensor.

5. The device of claim 1, wherein the detector circuit further includes a current sensing device inductively coupled to the sensor element and serially coupled to the system controller through an amplifier device, a derivative circuit, a peak detector circuit, and a comparator device.

6. The device of claim 1, wherein the system controller is a logic gate array.

7. An apparatus for recognizing the proper insertion of a portable memory element ("PME") within a receiving port of a containing structure, comprising:

a read/write device coupled to the receiving port;

a locking device coupled to the receiving port for securing a properly inserted PME;

a sensor element having a signal input and output electrically coupled to a system controller; and wherein the system controller includes a detector circuit having a current sensing device inductively coupled to the output of the sensor element and serially coupled to the system controller for evaluating a signal output of the sensor element to determine if the locking device has properly secured the inserted PME within the receiving port of the containing structure.

8. The apparatus of claim 7, wherein the locking device further includes an actuating plunger that interacts with the inserted PME.

9. The apparatus of claim 7, wherein the detector circuit further includes a current sensing device inductively coupled to the sensor element and serially coupled to the system controller through an amplifier device, a derivative circuit, a peak detector circuit, and a comparator device.

10. A process for securing a portable memory element ("PME") within a receiving port, comprising the steps of:

inserting the PME within the receiving port;

activating a locking element to secure the inserted memory element; and sensing if the locking element properly engages with the inserted PME, wherein the step of sensing determines the proper execution of the step of:

activating the locking element and further includes the steps of:

driving an solenoid with a pulsed signal to produce an inductive current signal;

amplifying the inductive current signal;

finding the derivative of the amplified inductive current signal;

recognizing the peak voltage of the derivative current signal; and comparing the peak voltage to a predetermined reference voltage.

11. The process of claim 10, wherein the step of sensing further includes recognizing a change in an inductive current signal caused by the step of activating the locking element.

* * * * *